United States Patent
Martinez Canedo et al.

(10) Patent No.: US 10,928,791 B2
(45) Date of Patent: Feb. 23, 2021

(54) MODEL-BASED HUMAN MACHINE INTERFACE (HMI)

(71) Applicant: Siemens Aktiengesellschaft, Munich (DE)

(72) Inventors: Arquimedes Martinez Canedo, Plainsboro, NJ (US); Lingyun Wang, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 379 days.

(21) Appl. No.: 15/772,618

(22) PCT Filed: Nov. 12, 2015

(86) PCT No.: PCT/US2015/060250
§ 371 (c)(1),
(2) Date: May 1, 2018

(87) PCT Pub. No.: WO2017/082899
PCT Pub. Date: May 18, 2017

(65) Prior Publication Data
US 2019/0121307 A1  Apr. 25, 2019

(51) Int. Cl.
*G06T 17/00* (2006.01)
*G05B 17/02* (2006.01)
*G06F 9/50* (2006.01)
*G06T 19/00* (2011.01)
*G06F 3/0481* (2013.01)
(Continued)

(52) U.S. Cl.
CPC ......... *G05B 17/02* (2013.01); *G06F 3/04815* (2013.01); *G06F 9/5044* (2013.01); *G06T 19/006* (2013.01); *G09G 5/377* (2013.01); *G06F 30/00* (2020.01); *G09G 2340/125* (2013.01); *G09G 2354/00* (2013.01)

(58) Field of Classification Search
CPC ...... G05B 17/02; G06F 9/5044; G09G 5/377; G06T 11/60; G06T 19/006
See application file for complete search history.

(56) References Cited

U.S. PATENT DOCUMENTS

2010/0082127 A1* 4/2010 Plache ............... G06F 9/5044
700/79
2014/0139549 A1* 5/2014 Chui ................. H04N 21/4223
345/619

FOREIGN PATENT DOCUMENTS

EP       2169598 A1   3/2010
WO   20120040567 A1   3/2012

OTHER PUBLICATIONS

International Search Report dated Mar. 9, 2016; Application No. PCT/US2015/060250; Filing Date: Nov. 12, 2015; 11 pages.

* cited by examiner

Primary Examiner — Charles Tseng (57) ABSTRACT

A model-based human machine interface (HMI) system is provided. The HMI system includes a plurality of output devices each having output capabilities that include at least one unique output capability level and a semantics library that is configured to receive SUC component models each having an output format and data. The semantics library is configured to analyze the data relative to the SUC component models and to transmit each of the SUC component models to one or more of the plurality of output devices. The one or more of the plurality of output devices are selected based on a correlation between the output capabilities of the plurality of output devices and the output format of the SUC component models.

20 Claims, 8 Drawing Sheets (51) Int. Cl.
*G09G 5/377* (2006.01)
*G06F 30/00* (2020.01)

MODEL-BASED HUMAN MACHINE INTERFACE (HMI)

This application is a national phase filing under 35 U.S.C. § 371 of International Patent Application No. PCT/US2015/060250, filed Nov. 12, 2015, which is incorporated herein by reference in its entirety.

BACKGROUND OF THE DISCLOSURE

The subject matter disclosed herein relates to a human machine interface (HMI) and, more particularly, to model-based HMI.

Conventional HMI systems rely on numeric, 2D or textual representations of a system and are usually created during the engineering phase of the system. They typically include ad-hoc models of various components of the system that are displayed in panels and computer screens where input/output mechanisms are text labels, input boxes, colors and basic drawings created with primitive drawing elements such as rectangles, circles and polygons. At best, these primitive elements can be grouped to create animations known as widgets that convey state changes over time (e.g., a status bar) or tags can be configured to link screen items, such as a picture of a heating unit, to a process value, such as a current temperature within the heating unit. In the tag case, a value change of the tags can trigger changes of the properties in on-screen graphic elements. That is, for the heating unit, once the temperature within the heating unit rises above a threshold value, the heating unit can be redrawn in red and may start to blink. Such two-dimensional (2D) effects thus provide only a snapshot or representation of a system and are not always intuitive or accurate.

In other words, conventional HMI systems tend to follow a "one size-fits-all" philosophy in which the HMI systems are limited to communicating information using only the basic interaction elements provided by the engineering system regardless of the type of information that is being communicated. This may lead to an information deficit because physical phenomena need to be oversimplified and summarized in order to be communicated.

Figure 1:
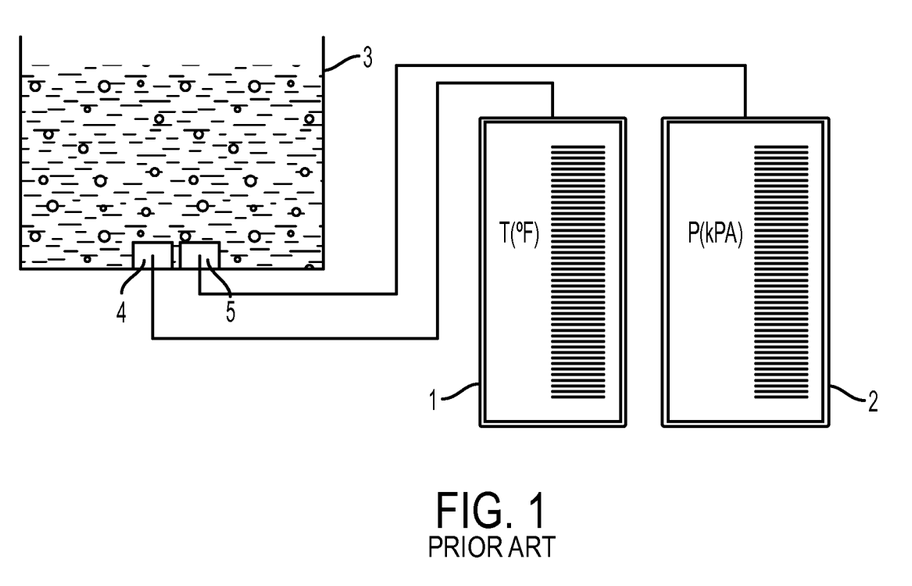
FIG. 1 is a schematic representation of a conventional human-machine interface (HMI) system.

An additional issue presented by conventional HMI systems is that they tend to be strongly coupled to stationary and centralized HMI system panels with a runtime that only allows certain input/output components for visualization. Therefore, in the heating unit example, even if a temperature in the heating unit can be represented (albeit in only 2D fashion), pressures within the heating unit can only be represented in other output elements. This is illustrated in FIG. 1 in which first gauge 1 and second gauge 2 are used by a system to represent the temperature and the pressure inside a single tank 3 as measured by temperature sensor 4 and pressure sensor 5. As shown in FIG. 1, there is no way to represent both parameters in a single output element, nor can the output elements provide a visualization of the tank itself or any indication that its components are malfunctioning.

BRIEF DESCRIPTION OF THE DISCLOSURE

According to one aspect of the disclosure, a model-based human machine interface (HMI) system is provided. The HMI system includes a plurality of output devices each having output capabilities that include at least one unique output capability level and a semantics library that is configured to receive SUC component models each having an output format and data. The semantics library is configured to analyze the data relative to the SUC component models and to transmit each of the SUC component models to one or more of the plurality of output devices. The one or more of the plurality of output devices are selected based on a correlation between the output capabilities of the plurality of output devices and the output format of the SUC component models.

According to another aspect of the disclosure, a model-based human machine interface (HMI) system for a system-under-control (SUC) including an SUC component is provided. The model-based HMI system includes an output device each having an output capability of a unique output capability level and a computing device disposable in signal communication with the output device and comprising a semantics library that is configured to receive an SUC component model having an output format and data. The semantics library is configured to analyze the data relative to the SUC component model and to transmit the SUC component model to the output device based on a correlation between the output capability of the output device and the output format of the SUC component model.

According to yet another aspect of the disclosure, a model-based human machine interface (HMI) method is provided. The model-based HMI method includes deploying a semantics library in a system-under-control (SUC), receiving, at the semantics library, SUC component models each having at least one unique output format and data, executing algorithms stored in the semantics library for analyzing the data relative to the SUC component models and transmitting each of the SUC component models to one or more output devices in accordance with the algorithms and a correlation between output capabilities of the one or more output devices and the output formats of the SUC component models.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION OF THE DISCLOSURE

The detailed description explains embodiments of the disclosure, together with advantages and features, by way of example with reference to the drawings.

For systems to be effective, they need to provide accurate and relevant information to human operators. Rather than relying on ad-hoc representations of components of a system under control, models provide a reusable, increasingly accurate and complete representation of the components and the system under control as a whole. Differences between models allow humans to understand the various states of the system under control from different viewpoints, such as mechanical, electrical, control, software, acoustic, thermal, etc. Thus, as will be described below, the following description relates to the provision in a system under control of different models. These models are synchronized through a semantic layer that so as to express various types of information about the system under control in various manners.

Figure 2:
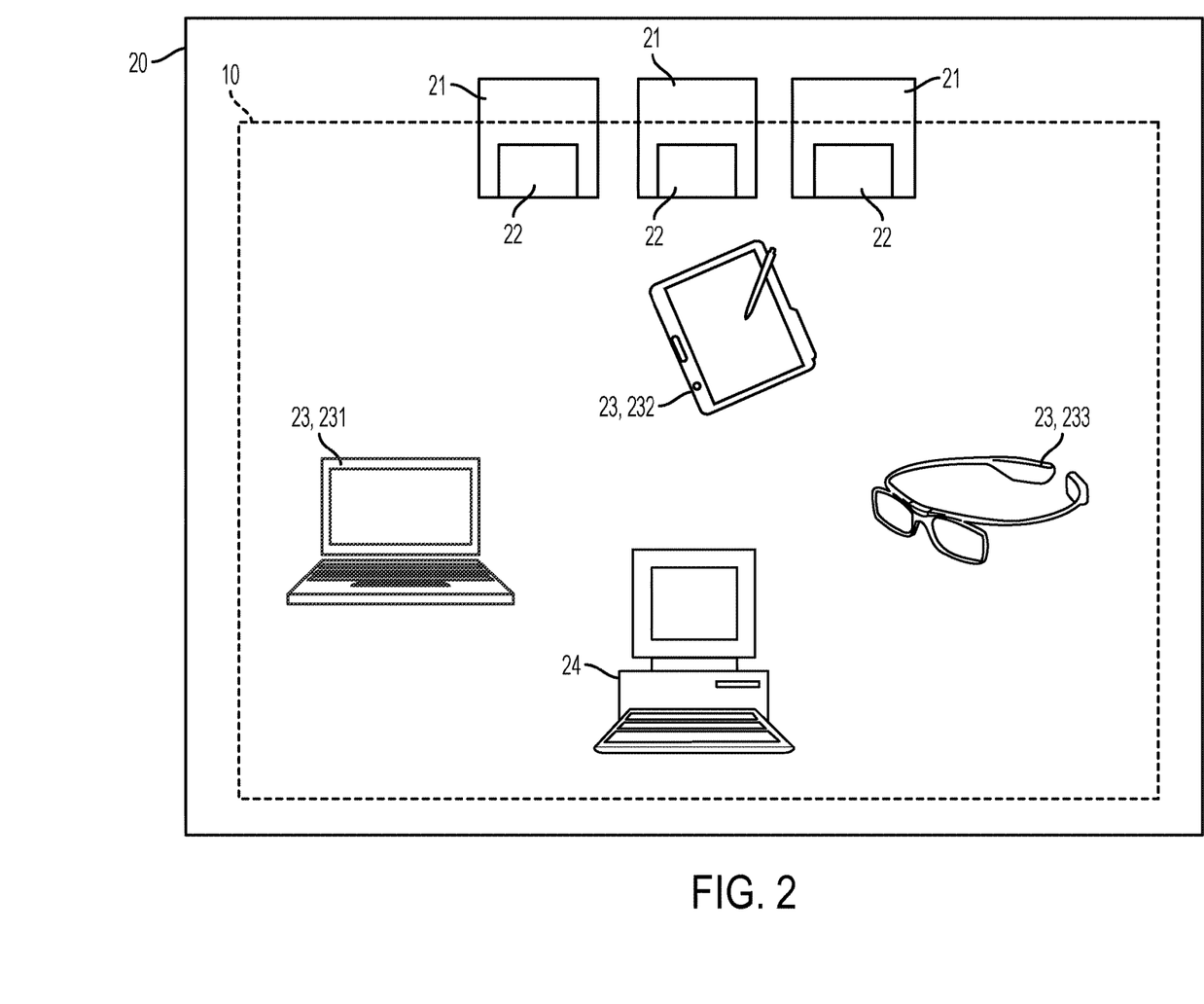
FIG. 2 is a schematic diagram of an HMI system in accordance with embodiments.
Figure 3:
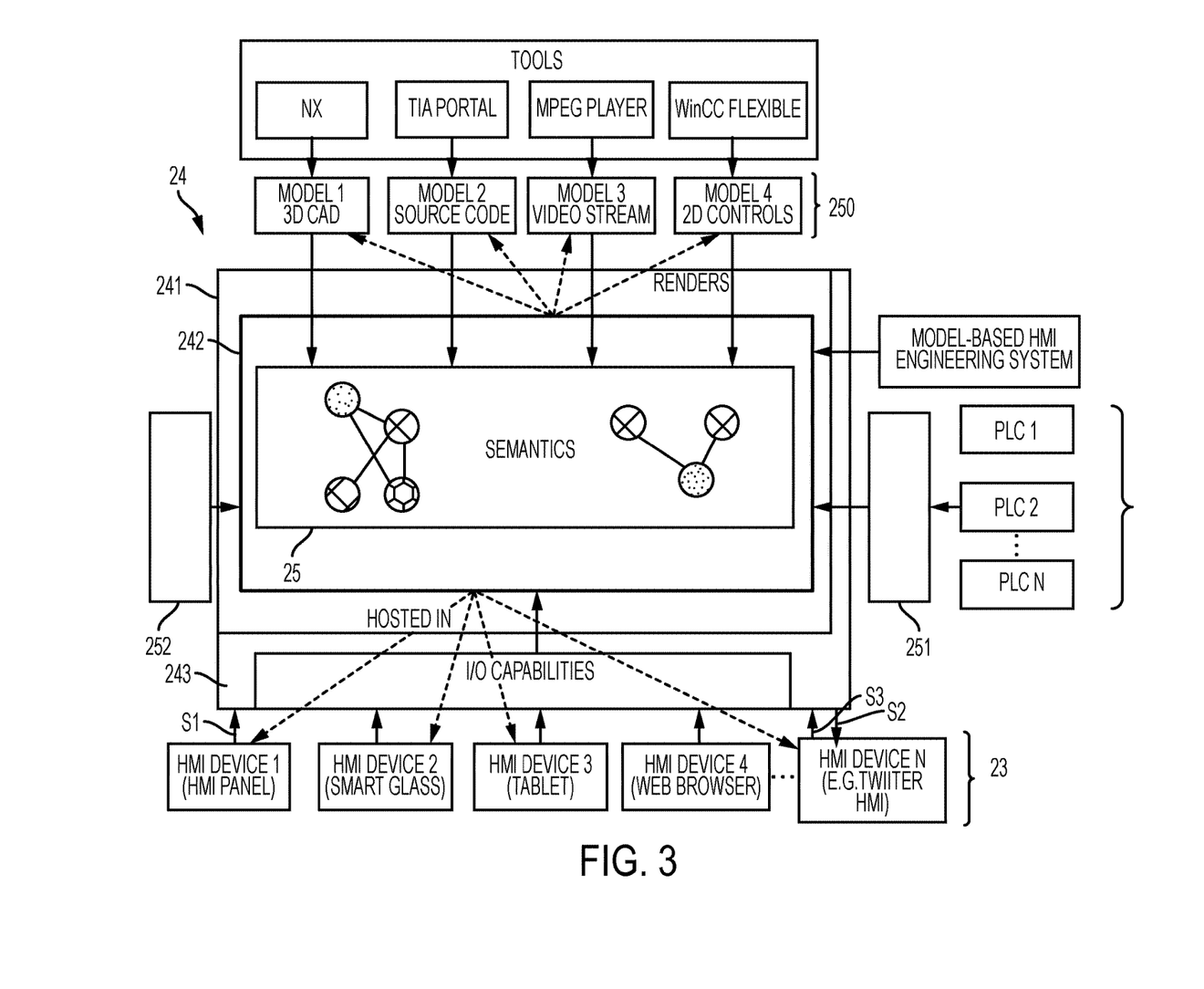
FIG. 3 is a schematic diagram of a semantics library of the HMI system of FIG. 2.

With reference to FIGS. 2 and 3, a model-based human machine interface (HMI) system 10 is provided and may be deployable in a system-under-control (SUC) 20. The SUC 20 may be any type of engineered system, such as, for example, a power plant or an automotive manufacturing site, and has multiple components (hereinafter referred to as SUC components 21) for various requirements. These SUC components 21 may include, for example, fluid tanks in which fluid is kept at a controlled temperature, valves and robotic machinery.

The HMI system 10 includes interfaces to multiple programmable logic interfaces (PLCs) 22, a plurality of output devices 23 and a central server or computing device 24. The PLCs 22 are distributed throughout the SUC 20 to sense various operations of at least the SUC components 21. The PLCs 22 may be employed to sense, for example, fluid temperatures and pressures in fluid tanks, open/closed states of valves and proper functioning of robotic machinery. In any case, the PLCs 22 generate data reflective of the sensing and are configured to transmit such data to the central sever or computing device 24 by way of wired or wireless connections.

The plurality of output devices 23 each have output capabilities defined with at least one unique output capability level and may include or be provided as HMI panels 231 having at least first (or low complexity) output capability levels, mobile or stationary computing devices 232 having at least second (or intermediate complexity) output capability levels, and mobile or stationary computing devices 233 having at least third (or high complexity) output capability levels. As used herein, the mobile computing devices 232/233 may include at least one or more of smart glasses, smartphones, tablets and laptop computers while the stationary computing devices 232/233 may include at least one or more of a desktop computer and a server.

As used herein, the terms low, intermediate and high complexity refer to the abilities of each of the output devices 23 to render and present for user interaction and interfacing a given textual or graphic display. For example, an output device 23 that can only present a textual or basic graphic display would have a low complexity output capability level. By contrast, a mobile computing device that can present both the textual/basic graphic display as well as an interactive three dimensional graphic display would have an intermediate to high complexity output capability level.

In accordance with embodiments, the low output capability levels may include, for example, two dimensional model rendering capabilities and overlayed data rendering capabilities, the intermediate output capability levels may include, for example, three dimensional model rendering capabilities and overlayed data rendering capabilities and the high output capability levels may include, for example, video streaming capabilities, three dimensional model rendering capabilities and overlayed data rendering capabilities. In any case, the HMI system 10 need not be restricted to three or any number of output capability levels. Each of the output devices 23 may have a different output rendering capability that may be suitable for rendering one particular type of model. With the semantic library 25 (to be discussed below), data can be understood among different models and thus a rendering of overlayed information, for example, is possible.

Figure 4:
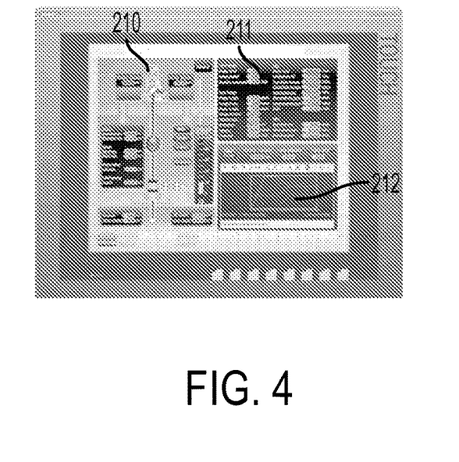
FIG. 4 is an illustration of two-dimensional HMI controls in an HMI panel of the HMI system of FIGS. 2 and 3.
Figure 5:
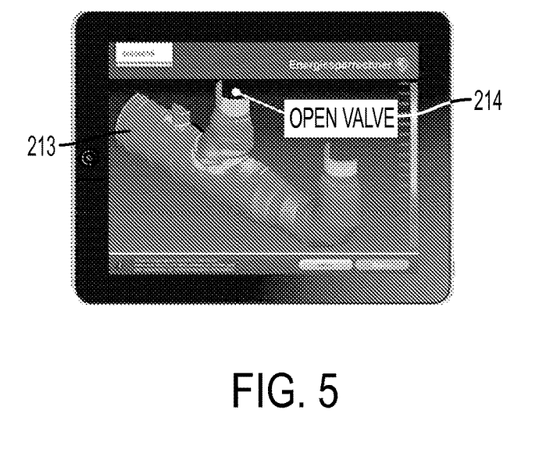
FIG. 5 is an illustration of a three-dimensional thermal model of the HMI system of FIGS. 2 and 3.
Figure 6:
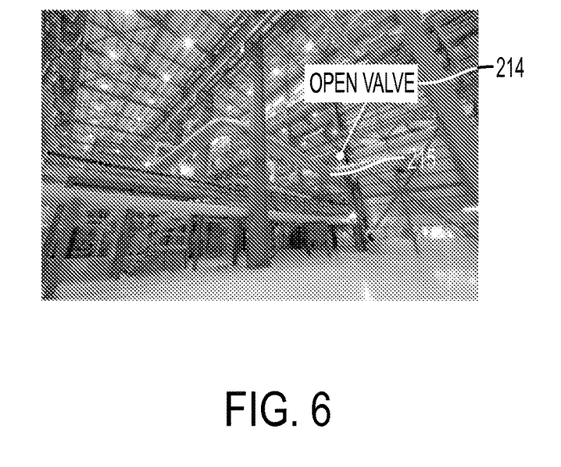
FIG. 6 is an illustration of an augmented reality video feed in smart glasses of the HMI system of FIGS. 2 and 3.

In the case of the low output capability levels, with reference to FIG. 4, the two dimensional model rendering capability may be provided for by a desktop computing device that is programmed to display a two dimensional model of a given SUC component 21 that displays a two dimensional schematic drawing 210 of the SUC component 21, various current operational conditions of the SUC component 21 as a series of numerical values 211 and historical data as a graphic element 212. In the case of the intermediate output capability levels, with reference to FIG. 5, the three dimensional model rendering capability may be provided for by a mobile or stationary computing device that is programmed to display a three dimensional model 213 of a given SUC component 21 along with overlayed data 214 or information relating to a current operational condition of that SUC component 21. In the case of the high output capability levels, with reference to FIG. 6, the three dimensional model rendering capability may be provided for by a mobile or stationary computing device that is programmed to display the three dimensional model 213 of a given SUC component 21, as well as an augmented video feed 215 of the SUC component 21 along with the overlayed data 214 or information.

As shown in FIG. 3, the central server or computing device 24 may include a processing unit 241, a memory unit 242 and a networking unit 243 by which the central server or computing device 24 is disposable in signal communication with the plurality of output devices 23. The processing unit 241 can be any type of central processing unit or microprocessor and the memory unit 242 may include any type of read/write, random access or read only memory. As a general matter, the central server or computing device 24 acts as a semantics library 25, which is receptive of the SUC component models 250 that each have at least one unique output format level and data 251 from the PLCs 22, and has algorithms 252 stored thereon for analyzing the data 251 relative to the SUC component models 250.

The SUC component models 250 may be provided as engineering models that are built prior to the construction of the SUC 20 and may serve to validate the SUC 20 and to provide precise specifications for the SUC components 21. The SUC component models 250 are domain-specific and may be used to analyze the SUC 20 from different two and three dimensional viewpoints, such as mechanical, electrical, control, software source code, thermal, acoustic, etc. The SUC models 250 are created using generalized or domain-specific three dimensional modeling, computer-aided-design (CAD) modeling, computer-aided-engineering (CAE) modeling, computer-aided-manufacturing (CAM) modeling, automation software code modeling, source code modeling, plant modeling, piping and instrumentation diagram (P&ID) modeling, animation modeling, video modeling, 2D control modeling and heat/thermal modeling. Other models, not created by traditional engineering efforts may also exist. As will be described below, the SUC component models 250 may be updateable in real-time.

In its condition as the semantics library 25, the memory unit 242 of the central server or computing device 24 has executable instructions stored thereon, which, when executed cause the processing unit 241 to be communicative with or to communicate with each of the output devices 23 and to transmit each of the SUC component models 250 to one or more of the output devices 23 by way of the networking unit 243 such that the output devices 23 can render the transmitted SUC component models 250 for user interfacing. The transmission of the SUC component models 250 is in accordance with the execution of the algorithms relative to the SUC component models 250 and respective incidences of consistency or correlations between output capabilities of the output devices 23 and output format levels of the SUC component models 250.

Figure 7:
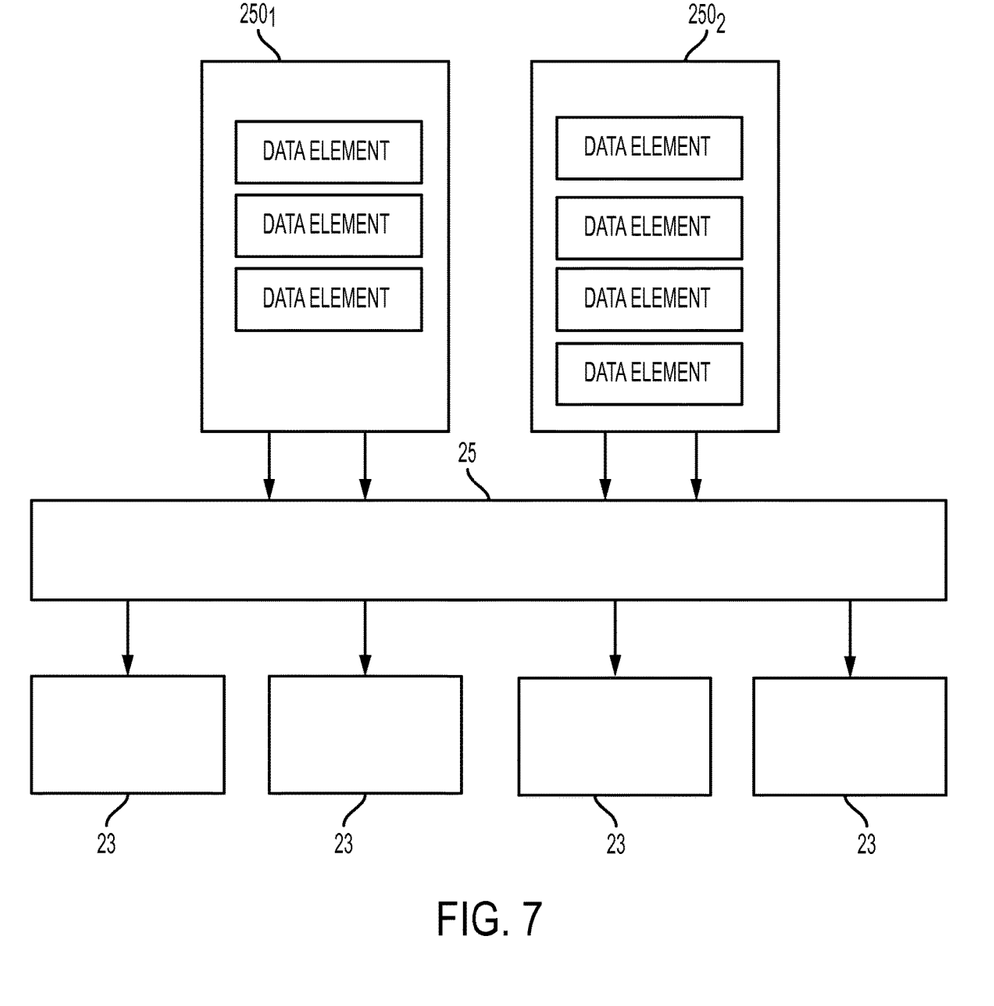
FIG. 7 is a schematic illustration of an operation of a semantics linrary of the HMI system of FIGS. 2 and 3.

With reference to FIG. 7, as an additional feature, the semantics library 25 may be configured to synchronize the SUC component models 250 so that an instance of information or data provided in one SUC component model 250 can be incorporated into another SUC component model 250 that is at least initially missing the instance of information or data. For example, as shown in FIG. 7, the semantic library 25 may be receptive of first and second SUC component models $250_1$ and $250_2$. The first SUC component model $250_1$ includes three data elements and the second SUC component model $250_2$ includes four data elements. Upon reception of the first and second SUC component models $250_1$ and $250_2$, the semantics library 25 analyzes the contents of each, determines that the first SUC component model $250_1$ lacks one of the data elements included in the second SUC component model $250_2$ and writes or, where the format of the first and second SUC component models $250_1$ and $250_2$ are substantially similar, copies the missing data element into the first SUC component model $250_1$. Subsequently, both the first and second SUC component models 2501 and 2502 can be output to corresponding output devices 23 with all four of the data elements originally included in the second SUC component model $250_2$.

In accordance with embodiments, the initial communications between the central server or computing device 24 and the output devices 23 may be one-way or two-way communications. For example, when the HMI system 10 is initialized, the output devices 23 may automatically each issue a one-way signal 51 to the networking unit 243 where such signal is indicative of the output capability levels of the output devices 23. Alternatively, in the two-way case, upon initialization of the HMI system 10, the central server or computing device 24 may send an interrogation signal S2 to each of the output devices 23 asking for an output capability level indicative response signal and each of the output devices 23 may respond by issuing signal S2 as the response signal. In any case, the central server or computing device 24 becomes aware or is made aware of the output capability levels of each of the output devices 23. In yet another alternative embodiment, the output devices 23 are initially registered with the HMI system 10 by an administrator where such registration includes a direct input of the output capability levels of each of the output devices 23 to the central server or computing device 24.

With the central server or computing device 24 made aware of the output level capabilities of each of the output devices 23, the central server or computing device 24 will be able to transmit only those SUC component models 250 to the output devices 23 that are capable of rendering the transmitted SUC component models 250 for user interaction and interfacing. That is, if a given SUC component model 250 is an augmented video stream (including overlayed data), the central server or computing device 24 may only send that SUC component model 250 to the mobile or stationary computing devices 233 having third (or high complexity) output capability levels (i.e., the smart glasses) for rendering and subsequent user interaction and interfacing. By contrast, if a given SUC component model 250 is a two dimensional panel display, the central server or computing device 24 may send that SUC component model 250 to any of the HMI panels 231 having first (or low complexity) output capability levels, the mobile or stationary computing devices 232 having second (or intermediate complexity) output capability levels and the mobile or stationary computing devices 233 having third (or high complexity) output capability levels.

Figure 8:
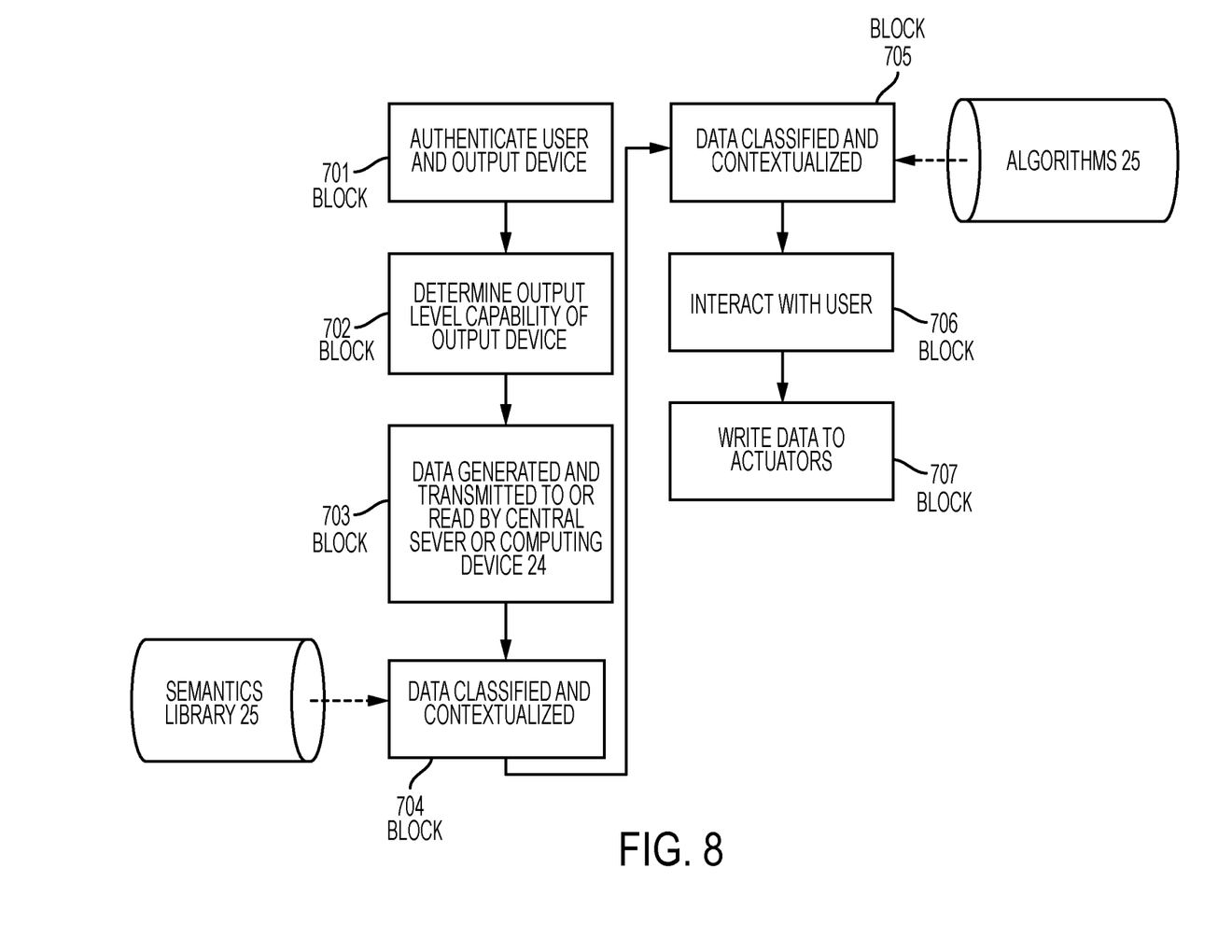
FIG. 8 is a flow diagram illustrating an operation of the HMI system of FIGS. 2-7.
Figure 9:
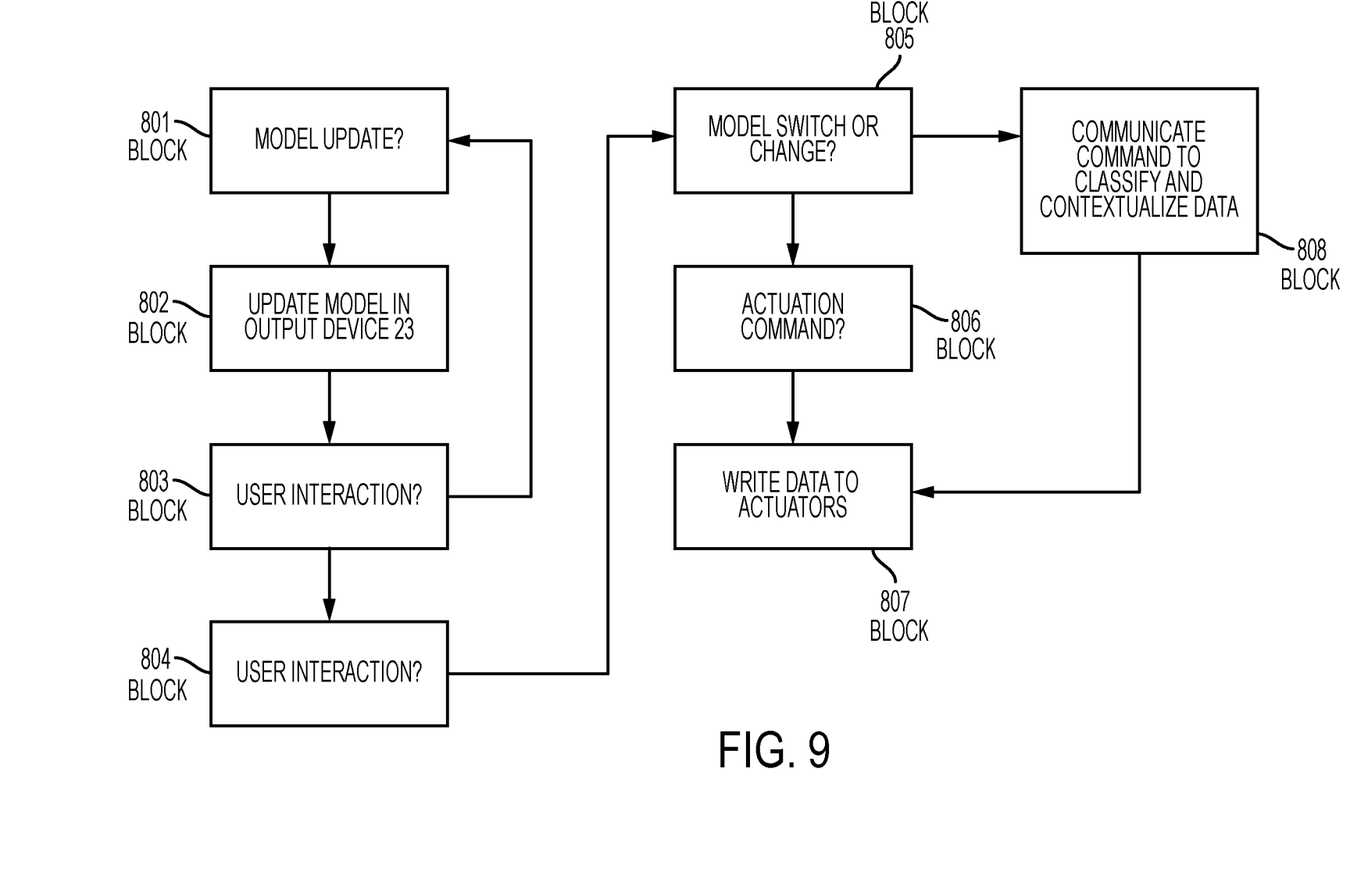
FIG. 9 is a flow diagram illustrating further operations of the HMI system of FIGS. 2-8.
Figure 10:
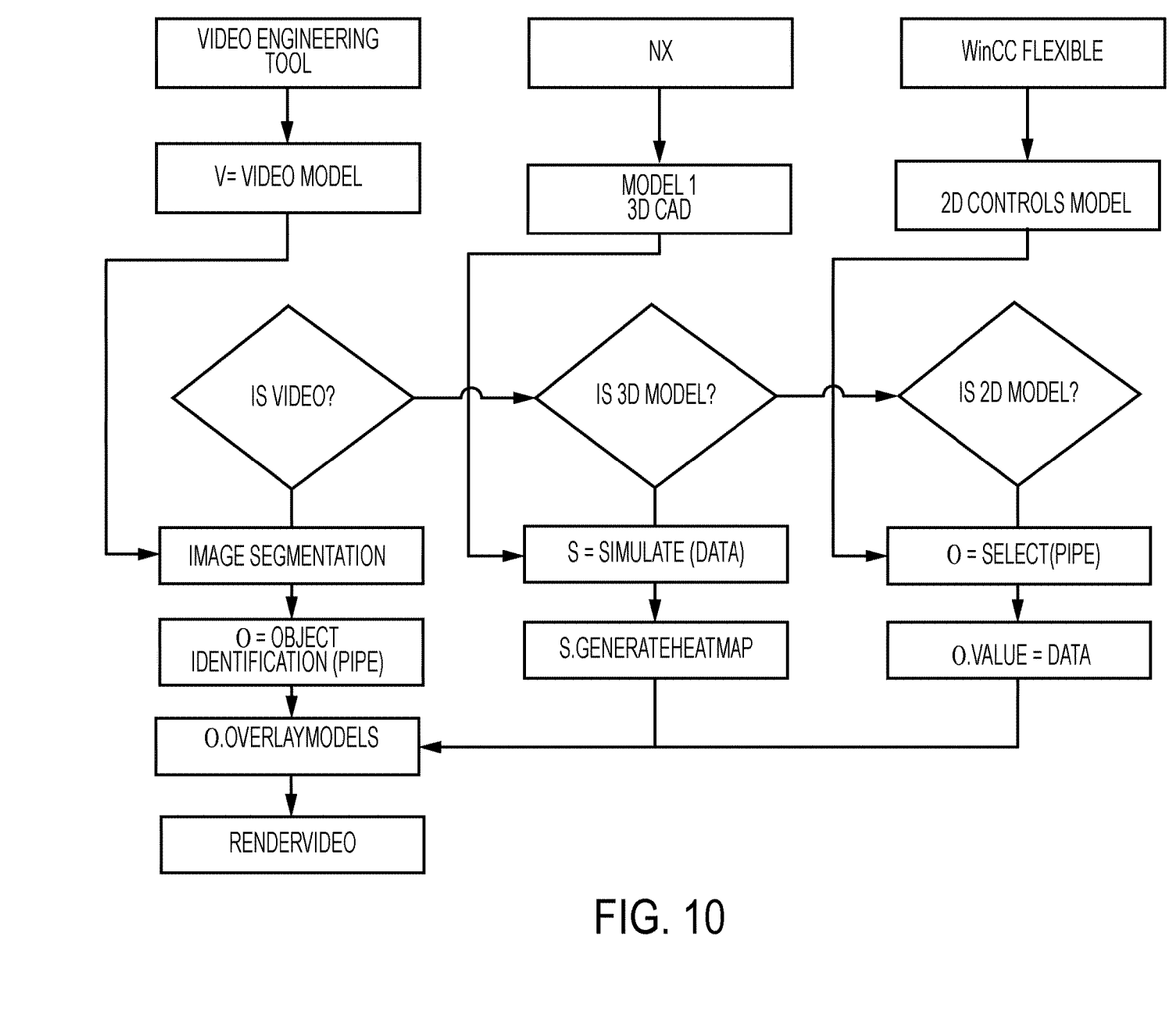
FIG. 10 is a flow diagram illustrating further operations of the HMI system of FIGS. 2-9.

With reference to FIGS. 8-10, various operations of the HMI system 10 will now be described.

As shown in FIG. 8, at block 701 representing an initial stage following deployment of the HMI system 10, the HMI system 10 authenticates a user and one or more of the output devices 23 and subsequently, at block 702, the central server or computing device 24 determines an output level capability of the one or more output devices 23. At this point, the PLCs 22 generate data regarding operational conditions of the SUC components 21 and either transmit such data to the central server or computing device 24 or such data is read from the PLCs 22 by the central server or computing device 24 at block 703. By way of the semantics library 25, the data is classified and contextualized at block 704 such that corresponding representations of the SUC component models 250 in their current operational condition can be computed in accordance with the algorithms 252 at block 705. The computed models are then presented to the user for interaction and interfacing at block 706 and any changes made to the SUC component models 250 due to user actions being taken are written into the memory unit 242 at block 707 as updates to the SUC component models 250 and/or the algorithms 252 whereupon control may revert to block 703.

As shown in FIG. 9, the presentation of the computed models to the user for interaction and interfacing of block 706 includes several sub-processes and stages. These include a determination at block 801 of whether a model update to one or more of the SUC component models 250 has been commanded, a corresponding model update at block 802 and a determination of whether a user action has occurred that necessitates a further model update at block 803. As shown in FIG. 8, if such a user action has occurred, control proceeds to block 804 where the user command is parsed and to block 805 where it is determined whether the user command relates to a switch or change of the SUC component model 250. If the user command does not relate to such a switch or change, it is determined whether the user command relates to an actuation command (e.g., opening a closed valve or closing an open valve) at block 806 and, if so, a data is written at block 807. On the other hand, if the user command does relate to a switch or change of the SUC component model 250, the user command is used to classify and contextualize data at block 808 and control proceeds to block 807.

A particular case in which the HMI system 10 is deployed in an SUC 20 is illustrated in FIG. 10. In this case, a pipe is an SUC component 21 in the SUC 20 and is leaking. The pipe is thus in a "hot" operational condition as identified by the corresponding PLCs 22 and as calculated by the processing unit 241 in accordance with the corresponding algorithm 252.

Since the HMI system 10 is characterized in that the semantics and concepts are decoupled from the output devices 23, it is understood that the hot operational condition of the pipe is a device independent concept that has to be addressed whereas the mode the concept is addressed with is device dependent (e.g., by graphics rendered on a panel, voice input/output on a smart phone or a twitter message output on a communication device) and that the central server or computing device 24 may be commonly relied upon by the output devices 23 as a computational engine. With this background, the HMI system 10 permits the relatively easy introduction of modern output devices 23 that can work with or replace outdated output devices 23 that are already in the field. These modern output devices 23 are updatable in a short cycle as compared to industrial HMI devices and the HMI system 10 permits the reuse of common device independent features and the addition of device dependent features to take advantage of this update-ability.

Turning to FIG. 10, if a video model is available for addressing the hot operational condition of the pipe, the frames are segmented and an attempt is made to identify the concept of "pipe" in the video stream. Once identified, the "pipe" in the video is overlayed with other results from the three and two dimensional models. If the three dimensional is available, the three dimensional CAD model is used to perform a thermal simulation based on the data generated by the corresponding PLC 22. The resulting heat map may be overlayed to the video stream. Similarly, if the two dimensional model is available, the pipe object may be selected and its value updated with the data from the PLC 22. This data value may also be overlayed in the video stream.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A model-based human machine interface (HMI) system, comprising:
    a plurality of output devices each having output capabilities that include an overlayed data rendering capability and at least one unique output capability level; and
    a semantics library that is configured to receive a plurality of system-under-control (SUC) component models each having an output format and data,
    wherein the semantics library is configured to analyze the data relative to each of the plurality of SUC component models and to selectively transmit each of the plurality of SUC component models to one or more of the plurality of output devices according to a correlation between the output capabilities of the plurality of output devices and the output format of each of the plurality of SUC component models,
    wherein the overlayed data rendering capability allows cumulative overlaying of different SUC component models of the plurality of SUC component models.

2. The model-based HMI system according to claim 1, wherein the plurality of output devices comprises:
    HMI panels having at least low complexity output capability levels;
    mobile or stationary computing devices having at least intermediate complexity output capability levels; and
    mobile or stationary computing devices having at least high complexity output capability levels.

3. The model-based HMI system according to claim 2, wherein the mobile computing devices comprise smart glasses, smartphones, tablets and laptop computers.

4. The model-based HMI system according to claim 2, wherein:
    the low complexity output capability levels comprise at least two dimensional model rendering capabilities and overlayed data rendering capabilities,
    the intermediate complexity output capability levels comprise at least three dimensional model rendering capabilities and the overlayed data rendering capabilities, and
    the high complexity output capability levels comprise at least video streaming capabilities, the three dimensional model rendering capabilities and the overlayed data rendering capabilities.

5. The model-based HMI system according to claim 1, wherein the plurality of SUC component models comprise three dimensional models, computer-aided-design (CAD) models, computer-aided-engineering (CAE) models, computer-aided-manufacturing (CAM) models, automation software code models, source code models, plant models, piping and instrumentation diagram (P&ID) models, animation models, video models, 2D control models and heat/thermal models.

6. The model-based HMI system according to claim 1, wherein the plurality of SUC component models are updateable in real-time.

7. The model-based HMI system according to claim 1, wherein the semantics library is embodied in a computing device in signal communication with the plurality of output devices.

8. The model-based HMI system according to claim 1, wherein the semantics library is configured to:
    interrogate each of the plurality of output devices to ascertain the at least one unique output capability level thereof; and
    determine which of the plurality of SUC component models are associated with the at least one unique output capability level of each of the plurality of output devices.

9. A model-based human machine interface (HMI) system for a system-under-control (SUC) including an SUC component, the model-based HMI system comprising:
    an output device having an output capability of a unique output capability level and an overlayed data rendering capability; and
    a computing device disposable in signal communication with the output device and comprising a semantics library that is configured to receive a plurality of SUC component models each having an output format and data,
    wherein the semantics library is configured to analyze the data relative to each of the plurality of SUC component models and to selectively transmit each of the plurality of SUC component models to the output device based on a correlation between the output capability of the output device and the output format of each of the plurality of SUC component models, and wherein the overlayed data rendering capability allows cumulative overlaying of different SUC component models of the plurality of SUC component models.

10. The model-based HMI system according to claim 9, wherein the output device comprises at least one of:
HMI panels having at least low complexity output capability levels;
mobile or stationary computing devices having at least intermediate complexity output capability levels; and
mobile or stationary computing devices having at least high complexity output capability levels.

11. The model-based HMI system according to claim 10, wherein the mobile computing devices comprise smart glasses, smartphones, tablets and laptop computers.

12. The model-based HMI system according to claim 10, wherein:
the low complexity output capability levels comprise at least two dimensional model rendering capabilities and overlayed data rendering capabilities,
the intermediate complexity output capability levels comprise at least three dimensional model rendering capabilities and the overlayed data rendering capabilities, and
the high complexity output capability levels comprise at least video streaming capabilities, the three dimensional model rendering capabilities and the overlayed data rendering capabilities.

13. The model-based HMI system according to claim 9, wherein the plurality of SUC component models comprise three dimensional models, computer-aided-design (CAD) models, computer-aided-engineering (CAE) models, computer-aided-manufacturing (CAM) models, automation software code models, source code models, plant models, piping and instrumentation diagram (P&ID) models, animation models, video models, 2D control models and heat/thermal models.

14. The model-based HMI system according to claim 9, wherein the plurality of SUC component models are updateable in real-time.

15. The model-based HMI system according to claim 9, wherein the semantics library is configured to:
interrogate the output device to ascertain the output capability thereof; and
determine whether each of the plurality of SUC component models is associated with the output capability.

16. A model-based human machine interface (HMI) method, comprising:
deploying a semantics library in a system-under-control (SUC);
receiving, at the semantics library, a plurality of SUC component models each having at least one unique output format and data;
executing algorithms stored in the semantics library for analyzing the data relative to each of the plurality of SUC component models;
transmitting each of the plurality of SUC component models to one or more output devices in accordance with the algorithms and a correlation between output capabilities of each of the one or more output devices and the at least one unique output format of each of the plurality of SUC component models; and
displaying cumulative overlaying of different SUC component models of the plurality of SUC component models on the one or more output devices.

17. The model-based HMI method according to claim 16, further comprising updating the plurality of SUC component models in real-time.

18. The model-based HMI method according to claim 16, further comprising determining whether an output capability level correlates with an output format level.

19. The model-based HMI method according to claim 16, further comprising one of:
receiving, at the semantics library, a signal reflective of at least one unique output capability of each of the one or more output devices; and
interrogating each of the one or more output devices to ascertain the at least one unique output capability thereof and determining which of the plurality of SUC component models are associated with the at least one unique output capability of each of the one or more output devices.

20. The model-based HMI method according to claim 16, further comprising synchronizing multiple SUC component models of the plurality of SUC component models.

* * * * *